United States Patent
Yoshida et al.

(10) Patent No.: US 7,772,575 B2
(45) Date of Patent: Aug. 10, 2010

(54) STENCIL DESIGN AND METHOD FOR CELL PROJECTION PARTICLE BEAM LITHOGRAPHY

(75) Inventors: Kenji Yoshida, Tokyo (JP); Takashi Mitsuhashi, Fujisawa (JP); Shohei Matsushita, Yokohama (JP); Akira Fujimura, Saratoga, CA (US)

(73) Assignee: D2S, Inc., San Jose, CA (US)

( * ) Notice: Subject to any disclaimer, the term of this patent is extended or adjusted under 35 U.S.C. 154(b) by 323 days.

(21) Appl. No.: 11/603,441

(22) Filed: Nov. 21, 2006

(65) Prior Publication Data

US 2008/0116397 A1    May 22, 2008

(51) Int. Cl.
*H01J 37/302* (2006.01)
(52) U.S. Cl. .................................. 250/492.23
(58) Field of Classification Search ............ 250/492.22, 250/492.23, 492.2, 492.21
See application file for complete search history.

(56) References Cited

U.S. PATENT DOCUMENTS

| | | | |
|---|---|---|---|
| 5,424,173 A | 6/1995 | Wakabayashi et al. |
| 5,459,771 A | 10/1995 | Richardson et al. |
| 5,986,292 A | 11/1999 | Mizuno et al. |
| 6,037,820 A | 3/2000 | Ishizaka |
| 6,511,048 B1 | 1/2003 | Sohda et al. |
| 6,560,768 B2 | 5/2003 | Inanami et al. |
| 6,756,159 B2 | 6/2004 | Inanami |
| 7,579,606 B2 | 8/2009 | Yoshida et al. |
| 2001/0046631 A1 | 11/2001 | Fujiwara et al. |
| 2002/0162088 A1 | 10/2002 | Inanami et al. |
| 2002/0175298 A1 | 11/2002 | Moniwa et al. |
| 2002/0179856 A1 | 12/2002 | Ito et al. |
| 2005/0242303 A1 | 11/2005 | Platzgummer |
| 2006/0033048 A1 | 2/2006 | Maruyama et al. |
| 2007/0125967 A1 | 6/2007 | Lapanik et al. |
| 2008/0116397 A1 | 5/2008 | Yoshida et al. |
| 2008/0116398 A1 | 5/2008 | Hara et al. |
| 2008/0118852 A1 | 5/2008 | Mitsuhashi |
| 2008/0120073 A1 | 5/2008 | Hara et al. |
| 2008/0305043 A1 | 12/2008 | Gregory et al. |

FOREIGN PATENT DOCUMENTS

| | | |
|---|---|---|
| EP | 0364929 A2 | 4/1990 |
| EP | 0518783 A1 | 12/1992 |
| JP | 2001274077 A | 10/2001 |

(Continued)

OTHER PUBLICATIONS

International Search Report and Written Opinion dated Sep. 19, 2008 for PCT/US2007/85097.

(Continued)

*Primary Examiner*—Jack I Berman
(74) *Attorney, Agent, or Firm*—The Mueller Law Office, P.C.

(57) ABSTRACT

A method and system for particle beam lithography, such as electron beam (EB) lithography, is disclosed. The method and system include selecting one of a plurality of cell patterns from a stencil mask and partially exposing the cell pattern to a particle beam, such as an electron beam, so as to selectively project a portion of the cell pattern on a substrate.

43 Claims, 11 Drawing Sheets

FOREIGN PATENT DOCUMENTS

JP          2006165146 A        6/2006

OTHER PUBLICATIONS

Kazama, T. et al., "Shot reduction technique for character projection lithography using combined cell stencil", Proceedings SPIE vol. 5992 (2005), pp. 59922V-1-59922V-8, SPIE, Box 10, Bellingham, WA 98227. (Paper attached: file name "shot.pdf").

Hattori, K. et al., "Electron Beam Direct Writing System EX-8D Employing Character Projection Exposure Method", Journal of Vacuum Science Technology, vol. B11(6) (1993), pp. 2346-2351, American Vacuum Society, 125 Maiden Lane, 15th Floor, New York, NY 10038. (Paper attached: file name "electron_beam.pdf").

Hara, S. et al., "Character Projection EB Data Conversion System Combined with Throughput Analyzer", Japanese Journal of Applied Physics, vol. 33 (1994), pp. 6935-6939, Japan Society of Applied Physics, Kudan-Kita building 5th floor, Kudan-Kita 1-12-3, Chiyoda-ku, Tokyo 102-0073, Japan. (Paper attached: file name "character_projection.pdf").

Nakasugi, T. et al. "Maskless Lithography Using Low Energy Electron Beam: Recent Results of Proof-of-Concept Tool", Journal of Vacuum Science Technology, vol. B20(6) (2002), pp. 2651-2656, American Vacuum Society, 125 Maiden Lane, 15th Floor, New York, NY 10038. (Paper attached: file name "maskless.pdf").

Fujino, T. et al., "Character-Build Standard-Cell Layout Technique for High-Throughput Character-Projection EB Lithography", Proceedings SPIE vol. 5853 (2005), pp. 161-167, SPIE, Box 10, Bellingham, WA 98227. (Paper attached: "character_built.pdf").

Yamada, A. et al., "Variable cell projection as an advance in electron-beam cell projection system", Journal of Vacuum Science Technology, B 22(6) (2004), pp. 2917-2922, American Vacuum Society, 125 Maiden Lane, 15th Floor, New York, NY 10038. (Paper attached: file name "JVTBD9_22_6_29176_1.pdf").

Kosai et al, "Throughput Enhancement in Electron Beam Direct Writing by Multiple-Cell Shot Technique for Logic Devices", 17th Annual SEMI/IEEE Advanced Semiconductor Manufacturing Conference, ASMC 2006, vol. 2006, pp. 253-256, Institute of Electrical and Electronics Engineers, 3 Park Ave. 17th floor, New York, NY 10016. (Paper attached: file name "kosai.pdf") .

Extended European Search Report dated Dec. 4, 2009 for U.S. Appl. No. 11/603,441.

International Search Report and Written Opinion dated Mar. 13, 2008 for PCT/US2007/085135.

Lapanik, D., U.S. Appl. No. 11/226,253, filed Sep. 15, 2006.

Office Action Summary of the United States Patent and Trademark Office mailed Dec. 11, 2009, U.S. Appl. No. 11/603,603, filed Nov. 21, 2006.

STENCIL DESIGN AND METHOD FOR CELL PROJECTION PARTICLE BEAM LITHOGRAPHY

RELATED APPLICATIONS

This application is related to co-pending U.S. Patent Application entitled, "Method and System for Improving Particle Beam Lithography", Ser. No. 11/603,603, filed concurrently herewith, the entire disclosure of which is expressly incorporated by reference herein.

BACKGROUND

1. Field

The field of the present invention relates to particle beam lithography, and in particular to stencil design and a method for cell projection particle beam lithography.

2. Description of Related Art

In current semiconductor manufacturing processes, optical lithography with photomasks is commonly used. Photomasks consist of a glass substrate and mask patterns drawn on it and are commonly used to form device patterns on a silicon wafer. However, as the feature size becomes smaller than the wavelength of the ultraviolet light, which is used to optically transcribe mask patterns onto a silicon wafer, optical proximity effect becomes significant and accurate transcription becomes difficult.

To correct this effect an Optical Proximity Correction (OPC) technique is used, which often requires costly computation time and electron beam (EB) writing time, resulting in a low manufacturing yield. To solve this mask cost issue, various approaches such as maskless lithography (ML2), which does not use a photomask, have been proposed. One of the promising approaches among various ML2 techniques includes electron beam direct writing (EBDW) and has been practically used by some semiconductor manufacturers.

Figure 1:
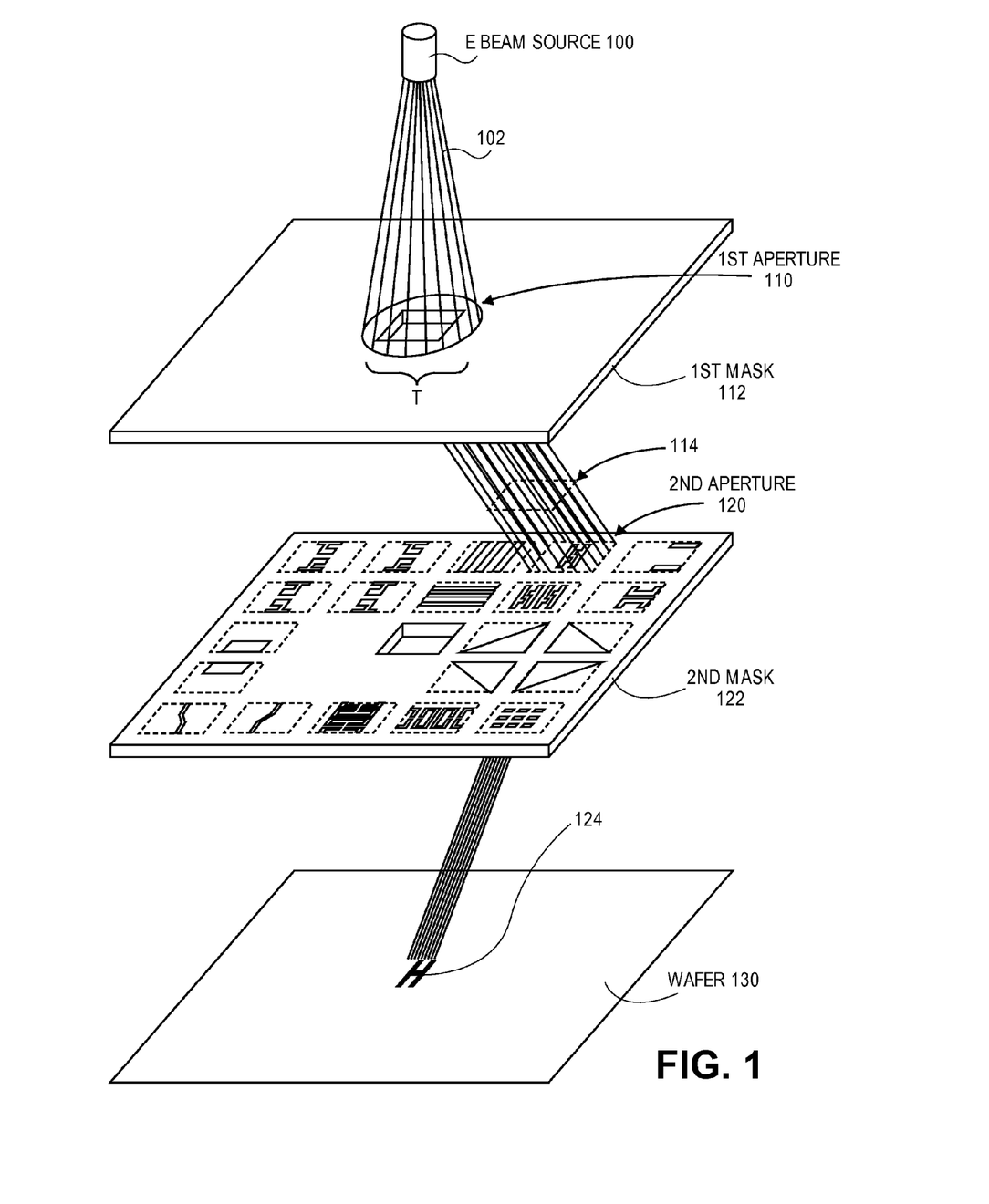
FIG. 1 shows a conventional electron beam (EB) writer with cell projection (CP) capability.

Referring to FIG. 1, a conventional particle beam writer, such as an electron beam (EB) writer, with cell projection (CP) capability provides for a cell projection particle beam write, such as a cell projection electron beam write. As shown, a particle or electron beam source 100 provides a particle or electron beam 102 to a first mask 112 that can be formed to a rectangular shape 114 with a first aperture 110 formed in the first mask 112. The rectangular beam 114 is then directed to a second mask 122 and through a second aperture 120 formed in the second mask 122. The second mask 122 is configured for EB lithography and includes apertures 120 that define various types of cell patterns.

Each cell pattern of the second mask 122 is indicative of various types of electronic circuit blocks, such as inverters, flip flops and memory blocks. For example, the electron beam 102 is shaped into the rectangular pattern of the first aperture 110, and then a complex cell pattern 124, such as an inverter, may be formed by electron beam projection through the second aperture 120 of the stencil mask 122.

In general, a variable shape beam (VSB) machine (not shown) would only have simple patterns in a second aperture, which result in simple shapes, such as rectangular or triangular shapes with variable sizes for projection on a wafer or substrate. A chip pattern may be drawn with these simple rectangular or triangular shapes. In the case of CP (cell projection), as shown in FIG. 1, the second aperture or stencil mask 22 may contain a plurality of cell patterns, such as about 100 cell patterns. Each cell pattern may comprise complex patterns on the scale of 10×10 um2 in size. Such patterns on stencil masks may include patterns of standard cell library entities, such as an inverter or flip-flop.

Figure 2:
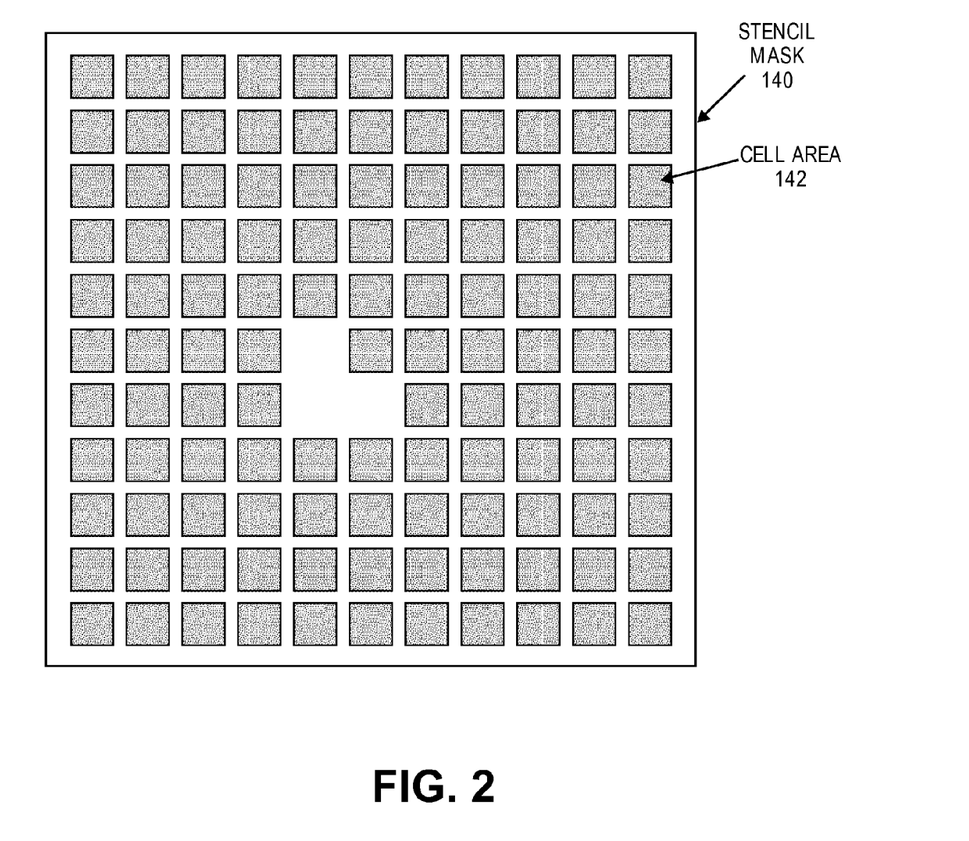
FIG. 2 shows a typical cell pattern layout on a stencil mask.

Referring to FIG. 2, a typical layout of a cell area, or cell patterns, 142 is formed on a stencil mask 140. By selecting one of such cells, the pattern can be drawn on a wafer by one shot of EB exposure, in contrast to ten or more shots with the case of a VSB machine, which greatly reduces EB writing time.

The cell projection (CP) technique was proposed to reduce writing time of EB. The CP technique enables a cell pattern to be drawn by one shot and thus reduces overall writing time compared to a conventional variable shape beam (VSB) method. However, a problem with CP is the limitation of the number of cells that can be contained on one stencil mask, such as 100. Since a cell library of ASICs usually has 300 to 500 cells and the stencil mask should contain all the possible orientations of each cell resulting in approximately 1200 to 2000 patterns needed on a stencil mask, each and every cell pattern needed is not likely to be accommodated on a single stencil mask. The limited cell number on the stencil results in that only a part of cells used in an integrated circuit (IC) chip can be written with CP and the remaining part of the chip pattern must be drawn by conventional VSB, which results in a limited throughput improvement and hinders its use for volume production. This drawback has restricted practical usage to only small volume production chips, such as ASICs, or purely for research purposes.

SUMMARY

To avoid the previously discussed problems of EBDW and CP, this invention provides techniques to largely reduce EB writing time by optimally utilizing cell projection capability.

In one aspect, this invention is related to the design method of stencils for particle beam writers, such as electron beam (EB) writers, with cell projection (CP) capability, and the stencils themselves, which are designed by this method. One feature of this invention enables a large number of cell patterns on a chip drawn by CP with a limited number of cell patterns on a stencil mask and thus enables a large throughput improvement using CP capability.

This invention may be applied to any type of particle beam lithography technologies which transcribe patterns using at least two apertures (stencil masks) and source of particle beams, such as optical laser beam and X-ray beam, as well as electron beam lithography.

In one embodiment, a method for particle beam lithography includes selecting one of a plurality of cell patterns from a stencil mask and partially exposing the cell pattern to a particle beam so as to selectively project a portion of the cell pattern on a substrate.

In one aspect, each cell pattern includes an aperture formed in the stencil mask. Each cell pattern includes a pattern indicative of an electronic circuit block. The electronic circuit block is a cell in the standard cell library including an inverter, a flip-flop, a logic gate or a memory cell. The cell pattern includes at least two independently usable block patterns placed together in a single cell area. Those independently usable block patterns may be arranged to adjoin each other either vertically or horizontally in the cell area, and, in addition, with keeping enough open space surrounding those adjoined block patterns. The open space includes a margin large enough to allow partial projection of one of the independent block patterns selectively.

In another aspect, the cell pattern as described above includes at least one block pattern and a plurality of repetitive patterns. The plurality of repetitive patterns cyclically repeat.

The portion of the cell pattern projected on the substrate includes the at least one block pattern and at least one repetitive pattern. Partially projecting the cell pattern on the substrate provides open space around the cell pattern. The open space includes a margin large enough to allow partial projection of the cell pattern on the substrate.

In still another aspect, particle beam lithography may comprise electron beam (EB) lithography, and the particle beam may comprise an electron beam. Alternately, particle beam lithography may comprise optical (light) laser lithography, and the particle beam may comprise an optical (light) laser beam. Alternately, particle beam lithography may comprise X-ray beam lithography, and the particle beam may comprise an X-ray beam.

In one embodiment, a method for particle beam lithography includes projecting a particle beam through a first aperture that defines an exposure area, directing the particle beam through a second aperture that defines a cell pattern, and selectively projecting a portion of the cell pattern on a substrate by using the first aperture as a mask to limit the exposure area of the first aperture to thereby partially expose the cell pattern to the particle beam.

In one aspect, the method comprises a partial projection technique. The first aperture is formed in an exposure mask, and the first aperture may include a rectangular aperture. The second aperture is formed in a stencil mask, and the second aperture or cell pattern is one of a plurality of second apertures or cell patterns formed in the stencil mask.

In one embodiment, a system for particle beam lithography includes a particle beam source and a mask having an aperture that defines a cell pattern, wherein selectively exposing a portion of the cell pattern to the particle beam source forms a partial image of the cell pattern on a substrate.

In one embodiment, a system for particle beam lithography includes a particle beam source, a first mask positioned for exposure to the particle beam source, the first mask having a first aperture that defines an exposure area, and a second mask positioned below the first mask and above a substrate, the second mask having a second aperture that defines a cell pattern, wherein exposing the particle beam to the first aperture and selectively exposing the particle beam to the second aperture forms a partial image of the cell pattern on the substrate.

In one embodiment, a stencil for particle beam lithography includes a plurality of cell patterns. Each cell pattern includes a plurality of exposure areas within a cell area that are individually selectable. Exposing a first exposure area of a first cell pattern to a particle beam selectively projects a first image of at least a portion of the first cell pattern on a substrate, and exposing a second exposure area of the first cell pattern, that is different from the first exposure area, to a particle beam selectively projects a second image of at least another portion of the first cell pattern, that is different than the first image, on the substrate.

These and other objects and advantages of the present teachings will become more fully apparent from the following description taken in conjunction with the accompanying drawings.

DETAILED DESCRIPTION

Various embodiments of the invention are described herein with reference to the drawings. It should be noted that the drawings are not drawn to scale and that elements of similar structures or functions are represented by like reference numerals throughout the drawings.

The following discussion describes EB direct writing (EBDW) as an application of particle beam lithography and should not be limited to only EB direct writing (EBDW), but the this invention can be applied to mask writing using an electron beam (EB) writer with cell projection (CP) capability, in a similar manner, resulting in an improved throughput.

Accordingly, it should be appreciated that this invention may also be applied to other drawing technologies with transcribed patterns using at least two apertures (stencil masks) and using other types of particle beams other than an electron beam (EB), such as an optical (light) laser beam, an X-ray beam or any other particle beams that run straight and stimulate a sensitive material (resist) layer to form patterns on a substrate.

According to one embodiment, this invention provides a method that enables a large increase in the number of cell patterns on a chip drawn by CP with the limited number of cell patterns on a stencil mask and, thus, enables a large throughput improvement using CP. Additionally, in various embodiments, this invention provides a technique of designing stencil masks for CP and applying a Partial Projection (PP) technique, which selectively projects only a part of a cell pattern on a substrate, using a first aperture as another mask to limit an exposure area. This exposure area may comprise a rectangular shape of 10×10 um2, as an example.

Figure 3:
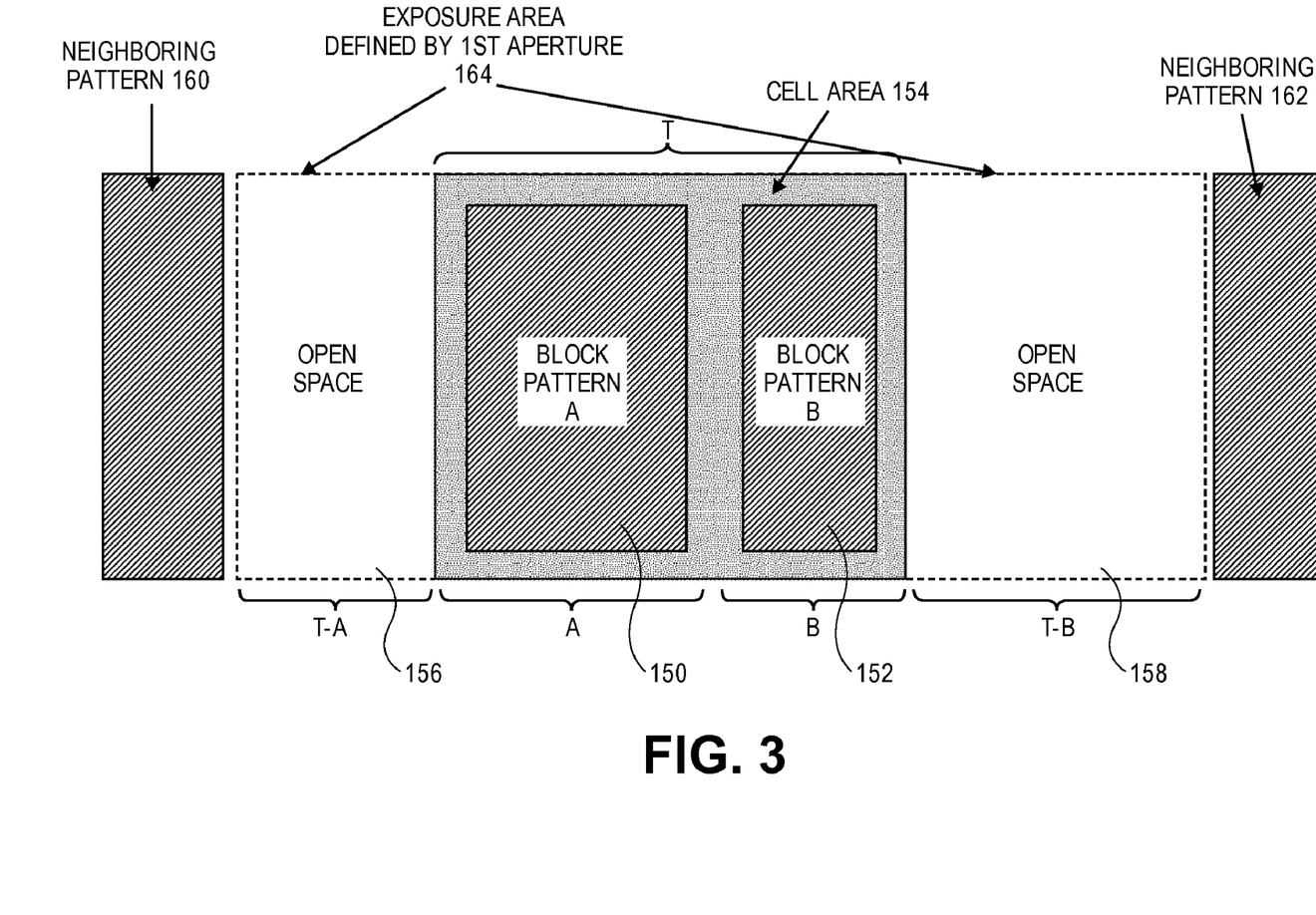
FIG. 3 shows an embodiment of a cell pattern layout on a stencil mask.

FIG. 3 shows an embodiment of a cell pattern layout on a stencil mask. For example, in one aspect, two independently usable block patterns, A and B, 150, 152, are included in a cell area (T) 154 or 142 of FIG. 2, and the surrounding area includes open space 156, 158. A stencil mask may comprise a cell pattern that includes a plurality of independently usable block patterns 150, 152 together in the same cell area 154 and, in addition, keeps enough open space 156, 158 in the surrounding region of the cell area 154. This open space 156, 158 must be wide enough so that one portion (block pattern) of this cell pattern can be exposed by partial projection without neighboring cell patterns 160, 162 being exposed simultaneously. Or, in other words, any neighboring cell pattern 160, 162 is located far enough away so that any part of it is not included in the exposure area 164 when the location of the exposure area 164 is adjusted to include only one block pattern, either A or B, 150, 152, for example, in this case of FIG. 3.

In one aspect, one cell area as described above includes at least two independent cell patterns, and the cell patterns may comprise a rectangular, triangular, or rectilinear shape or contour. The rectilinear-shaped contour improves the combination of two cell patterns that can be mated due to similar interconnecting features. It should be appreciated that there are two ways of combining or mating cell patterns. In one example, combining or mating of cell patterns can be achieved on the stencil, or in another example, combining or mating of cell patterns can be achieved when the cell patterns are drawn on the wafer or substrate.

Figure 4A:
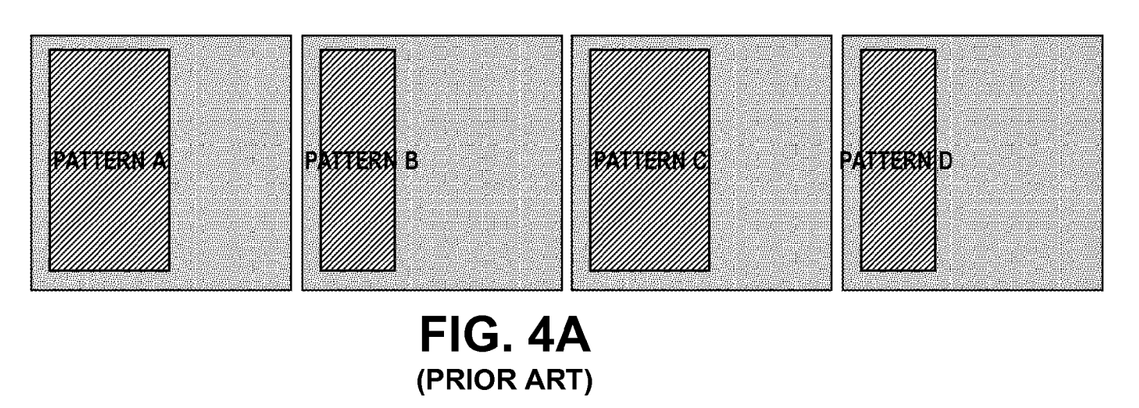
FIG. 4A shows a conventional cell pattern layout.
Figure 4B:
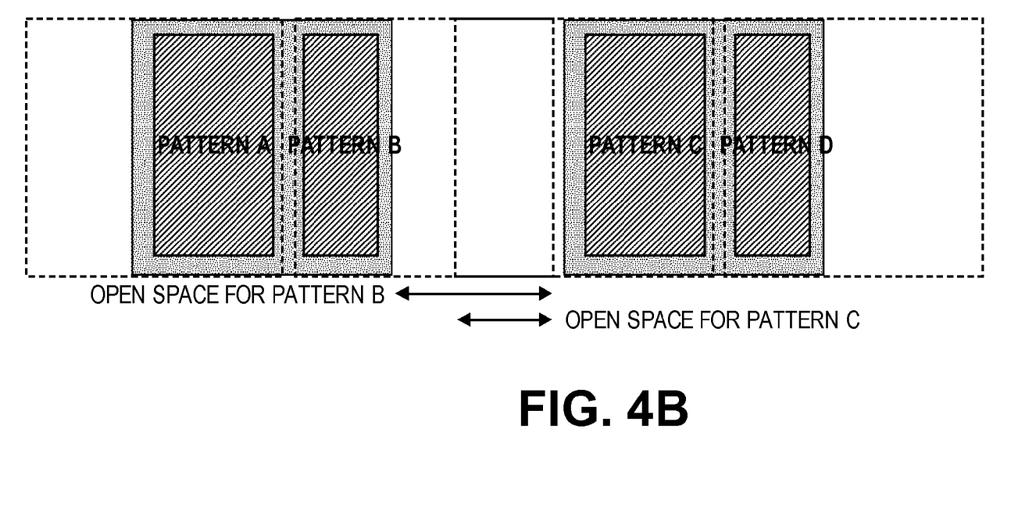
FIG. 4B shows an embodiment of a cell pattern layout with two neighboring cell patterns.

FIG. 4A shows a conventional cell pattern layout, and FIG. 4B shows a cell pattern layout by this invention, wherein two neighboring cell patterns share a common open space surrounding them.

The size of the cell area can be either smaller than the size of the exposure area, or larger than the size of the exposure area. As to the open space of the stencil mask, open spaces for neighboring two cell patterns can be overlapped so that overall area needed for those cells can be greatly reduced, as shown in FIG. 4B compared to FIG. 4A, which shows, for example, the case of conventional non-overlapped open space.

Another application is a similar method to layout the two block patterns in a vertical manner (upper and lower), in contrast to the horizontal manner, as previously shown in FIG. 3 or 4. It should be appreciated that the layout of the block patterns may be arranged vertically, horizontally, and/or both vertically and horizontally in the cell area without departing from the scope of the invention.

Figure 5:
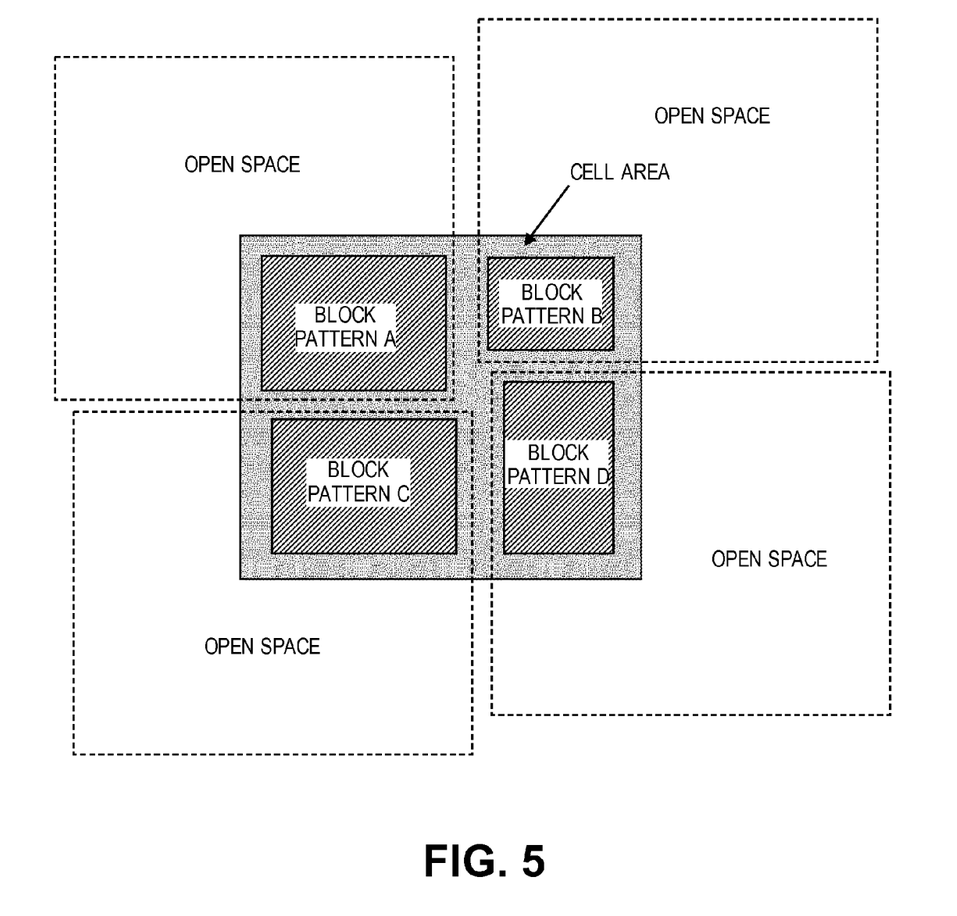
FIG. 5 shows other embodiments of cell patterns.

FIG. 5 shows another application of a cell pattern that positions four blocks together in a cell area. As shown, four block patterns are included and laid out in a vertical and horizontal manner, with surrounding open spaces in the four directions. In these cases, the surrounding area should have enough space so that any one part of a cell pattern can be exposed in a separate manner without neighboring patterns being exposed.

Figure 6:
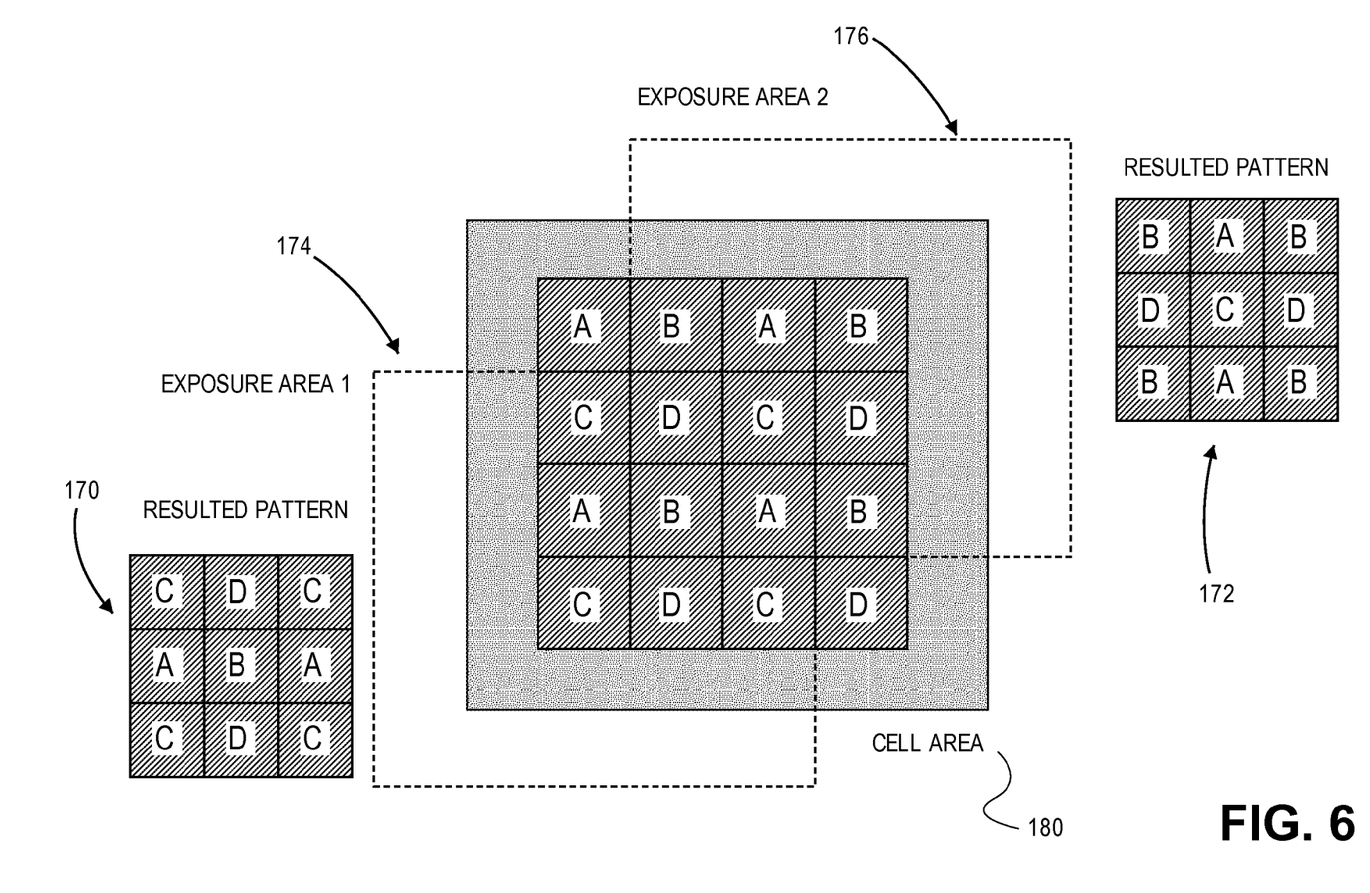
FIG. 6 shows an embodiment of a cell pattern with repetitive unit patterns.

FIG. 6 shows an example of a cell pattern with repetitive unit patterns. In one embodiment, the plurality of repetitive unit patterns comprise a cyclically repeating pattern. For example, as shown in FIG. 6, four different unit patterns are cyclically formed, and by selecting different exposure areas, different cell patterns with different block patterns and different sizes can be formed with combinations of ABCD patterns.

A stencil mask may comprise repetitive patterns as a cell pattern, which can be used as sub-patterns with a smaller number of repetition, and in addition, keeps enough open space in the surrounding region of the cell area. This open space must be wide enough so that any sub-pattern with a smaller number of repetition can be exposed by partial projection without neighboring cell patterns being exposed simultaneously as previously described.

In one aspect, the size of the cell area may be either smaller or larger than the size of the exposure area, and the repetition may be either on a horizontal (X) direction, on a vertical direction (Y), or a combination of horizontal (X) and vertical (Y) directions. This may include not only repeating the same unit pattern but also repeating a set of different unit patterns in a cyclical manner.

In one embodiment, the different unit patterns may be either completely different patterns or different orientations of the same pattern. In one example, repetition is often used in memory design.

FIG. 6 shows an example of such a stencil pattern and its application. In this case, two different patterns 170, 172 can be drawn in cell area 180 by partial projection using two different choices of exposure area 174, 176 in addition to a free choice of repetition size using the same cell pattern. In this manner, a large number of block patterns with any combination of repetitive patterns can be exposed by using a stencil mask with fixed size. By using only one fixed cell pattern, much increased number of cell patterns can be drawn. In one example, application of this technology is achieved with repetitive patterns, such as memory blocks.

Figure 7A:
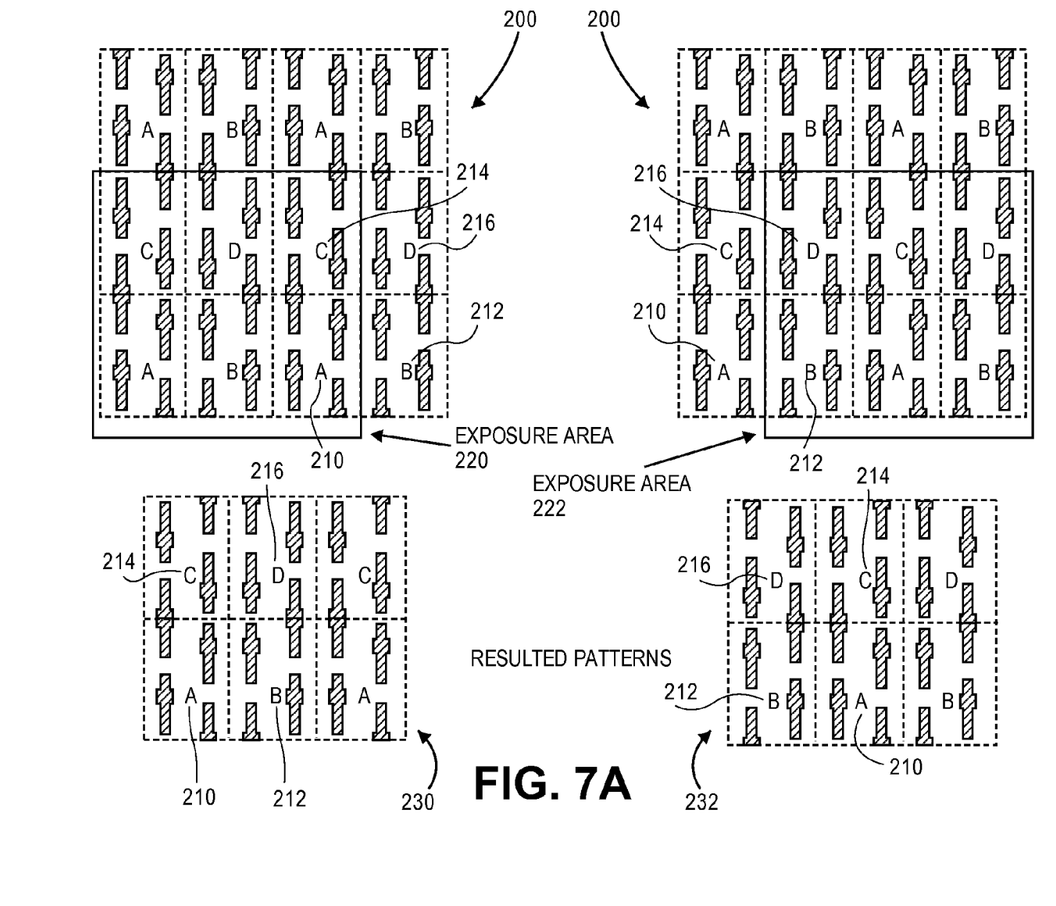
FIGS. 7A and B show embodiments of memory cell patterns.
Figure 7B:
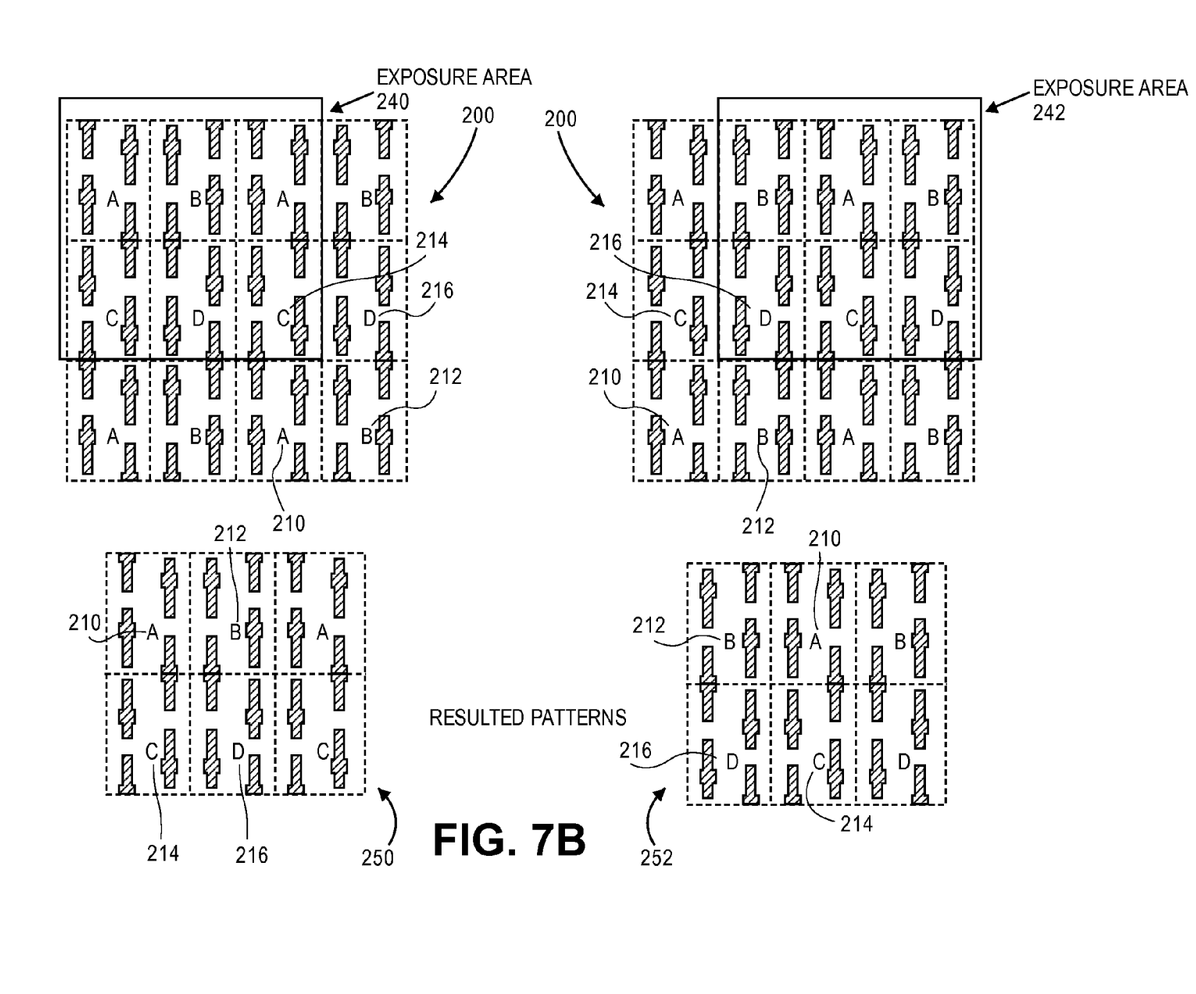

FIGS. 7A and 7B show examples of memory cell patterns. In one aspect, memory patterns with different configurations may be obtained by selecting a different position of exposure area.

In one embodiment, stencil mask 200 may comprise a plurality of cell patterns 210, 212, 214, 216 that include a combination of independent block patterns and repetitive patterns in a same cell area, and in addition, keeps enough open space in the surrounding region of the cell area. This open space must be wide enough so that any sub-pattern with smaller number of repetition can be exposed by partial projection without neighboring cell patterns exposed simultaneously, as previous described.

In one embodiment, different exposure areas of the same stencil masks may produce different resultant patterns. In one example, as shown in FIG. 7A, different exposure areas 220, 222 of the same stencil mask 200 produce different resultant patterns 230, 232. Similarly, in another example, as shown in FIG. 7B, different exposure areas 240, 242 of the same stencil mask 200 produce different resultant patterns 250, 252.

Figure 8:
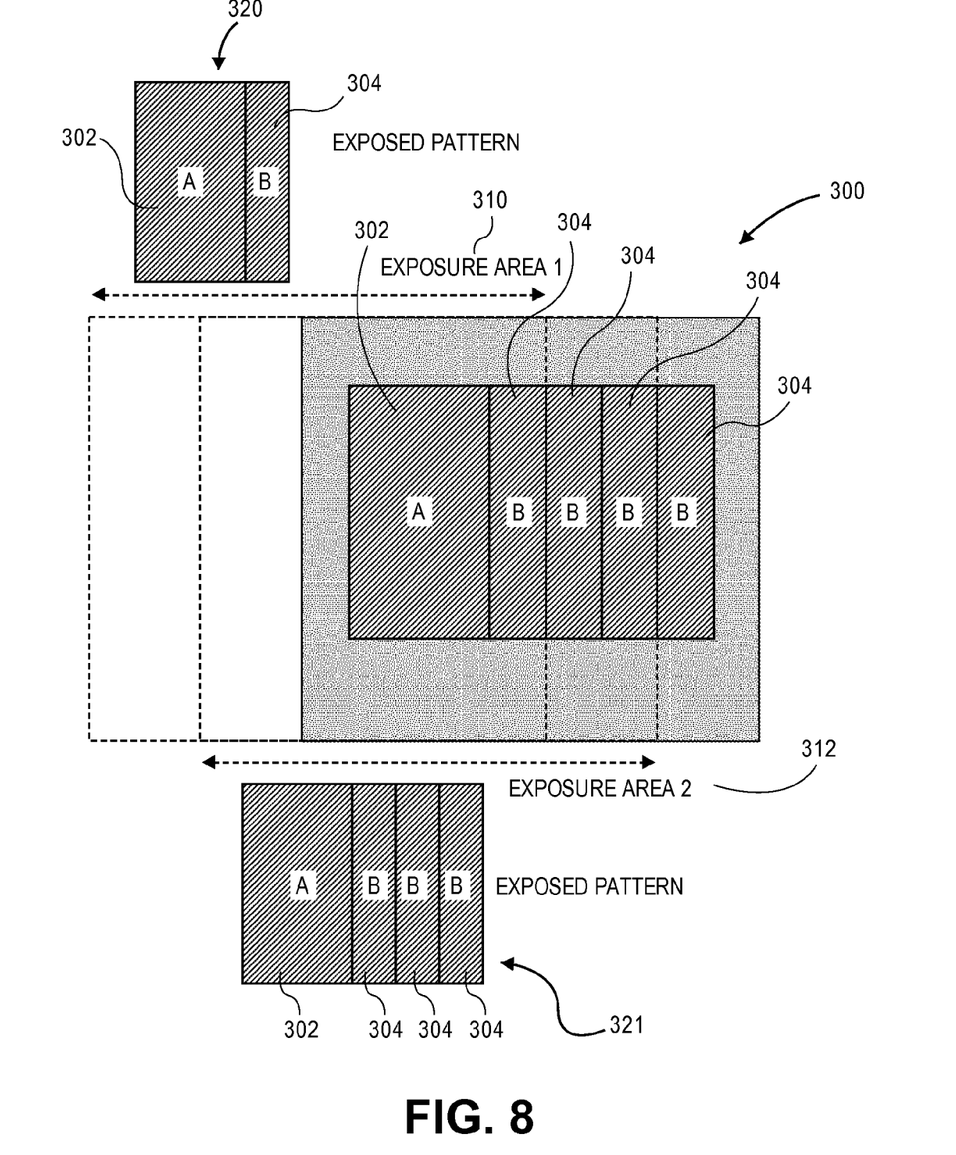
FIG. 8 shows an embodiment of a cell pattern including repetitive and non-repetitive block patterns.

FIG. 8 shows another embodiment of a cell pattern that includes repetitive block and non-repetitive block patterns. As shown in FIG. 8, a cell pattern 300 may comprise one normal block pattern (A) 302 and repetitive unit patterns (B) 304. Selecting different exposure areas 310, 312, different cell patterns 320, 321 may be drawn using fixed cell pattern 300. For example, as shown in FIG. 8, resultant cell pattern 320 having a single (A) pattern 302 and single (B) pattern 304 may be drawn or formed with first exposure area 310. In another example, a resultant cell pattern 321 having a single (A) pattern 302 and three (B) patterns 304 may be drawn or formed with second exposure area 312. One example of this technique is with inverters having different drivability.

Figure 9:
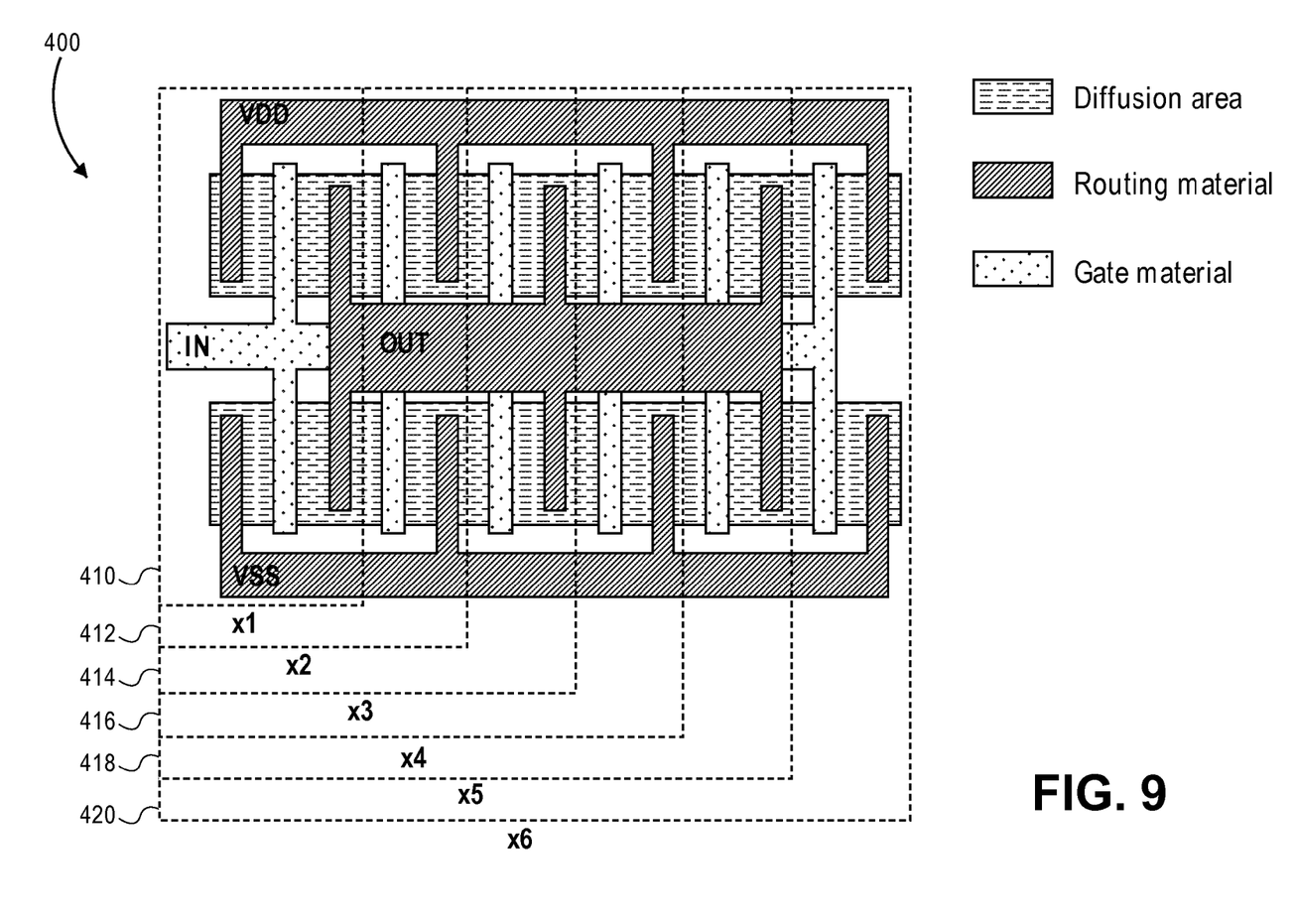
FIG. 9 shows an embodiment of an inverter cell pattern.

FIG. 9 shows an example of an inverter cell pattern 400 having different drivability by selecting the different positions of exposure area 410, 412, 414, 416, 418, 420. In one aspect, the example in FIG. 9 shows an embodiment of repetitive patterns on the right side, but this invention also includes an embodiment of the opposite left side, and embodiments in that each of those configurations are in a vertical direction.

In one aspect, the cell pattern of FIG. 9 comprises three layers of patterns, and diffusion area, routing material (or metal layer), and gate material (or poly-silicon layer), which include physical regions formed by those layers, respectively. IN and OUT represent the functionality of the circuit or the name of signals, such as IN: input (terminal), OUT: output (terminal), VDD: power supply, and VSS: ground. ×1, ×2, ×3, ×4, ×5, ×6, etc. represents the strength (times 1, times 2, times 3, times 4, times 5, times 6, etc.) of drivability of the inverters, which are formed by partial exposure at these different positions. For example, the smallest inverter formed may have a basic drivability of 1, and the largest inverter formed may have a 6 times stronger drivability. Inverters with ×2 to ×5 drivability may be formed by using partial exposure with each different position.

It should be appreciated that this invention includes the method of electron beam (EB) exposure that uses the above described stencil masks for cell projection (CP) and also uses partial projection (PP) techniques in addition to the stencil mask design itself.

Figure 10:
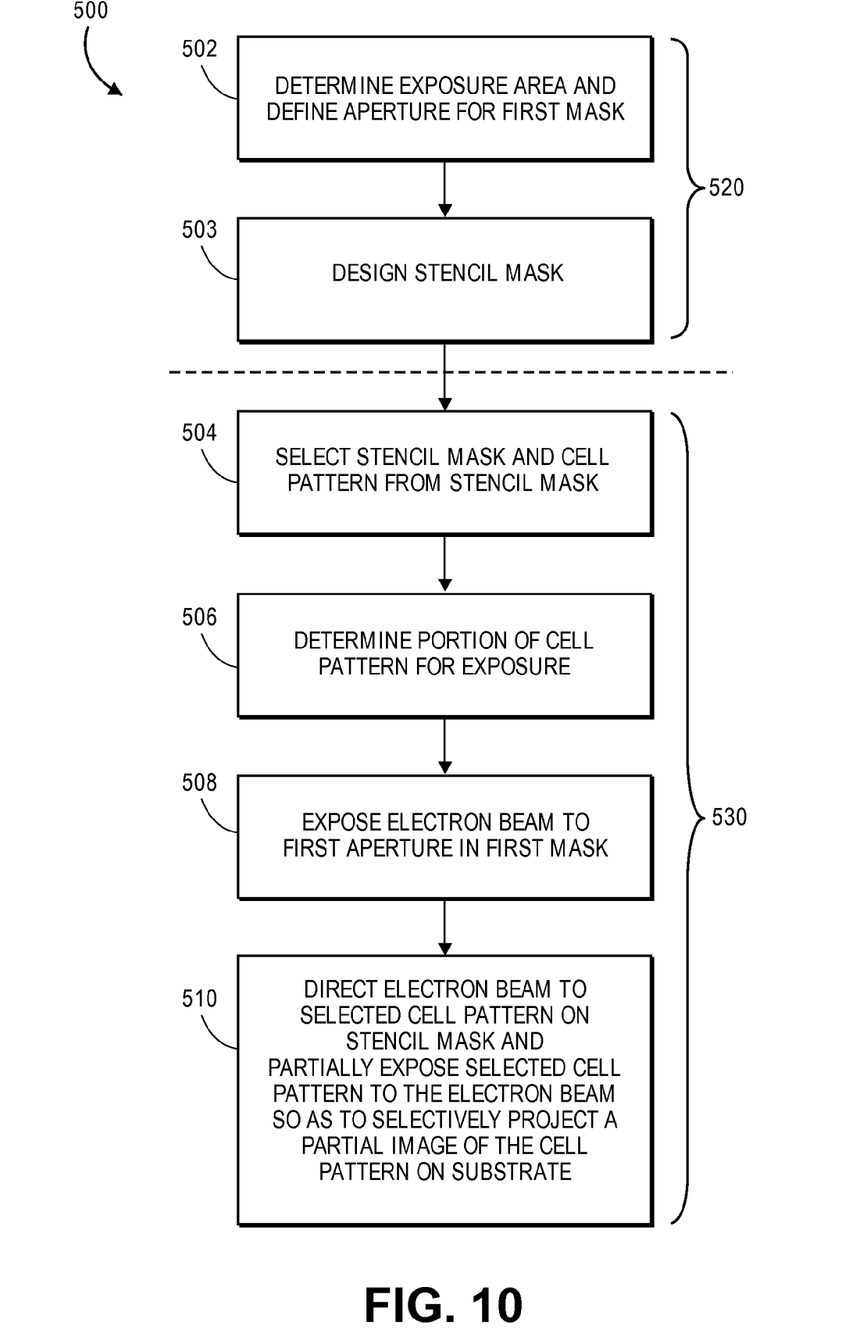
FIG. 10 shows a process flow diagram of an embodiment of a method for electron beam lithography.

FIG. 10 shows a process flow diagram of one embodiment of a method 500 for electron beam lithography. It should be appreciated that the following discussion of method 500 is provided in conjunction with reference to FIGS. 1-9. In one aspect, for reference purposes, the method 500 is divided into two groups or components: a preparation component 520 and an e-beam (EB) writing component 530.

Referring to the preparation component 520, in step 502, the method 500 includes determining the exposure area and defining the aperture 110 of the first mask 112, which may also be referred to as an exposure mask. In step 503, the second mask or stencil mask 112 is designed to accommodate desired cell patterns.

Referring to the e-beam writing component 530, in step 504, the method 500 includes selecting the second mask or stencil mask 122 and the second aperture or cell pattern 120 from the stencil mask 122. In step 506, the method 500 includes determining a portion of the cell pattern 120 for exposure to the electron beam 102. In step 508, the method 500 includes exposing the electron beam 102 to the first aperture 110 formed in the first mask 112. In step 510, the method 500 includes directing and/or projecting the electron beam 102 to the selected second aperture or cell pattern 120 formed in the stencil mask 122. In addition, step 510 includes partially exposing the selected cell pattern 120 of the stencil mask 122 to the electron beam 102 and projecting a partial image 124 of the cell pattern 120 on a substrate or wafer 130.

In one aspect, cell projection (CP) is an effective technique to reduce the writing time of electron beam (EB). However, the problem of CP is the limitation of the number of cells that can be contained on one stencil mask. Only a part of the cells used in an IC chip can be written with CP, resulting in a limited throughput improvement.

This invention is related to the design method of a stencil for CP, and the stencil itself that enables a large number of cell patterns on chip effectively drawn with limited number of cell patterns on a stencil mask, and thus enables a large improvement of writing speed and throughput using CP capability.

Even though the above discussion describes mainly the case of EB direct writing, application of this invention should not limited to EB direct writing but can be applied to mask writing using an EB writer with the CP capability, in a similar manner, resulting in an improved throughput.

Moreover, it should be appreciated that this invention may also be applied to other drawing technologies with transcribed patterns using at least two apertures (stencil masks) and using other types of beams than EB, such as an optical (light) laser bean, an X-ray beam, or any other beams which runs straight and can stimulate the sensitive material (resist) layer to form patterns on the substrate.

Although particular embodiments of the invention have been shown and described, it will be understood that it is not intended to limit the invention to the preferred embodiments, and it will be obvious to those skilled in the art that various changes and modifications may be made without departing from the scope of the invention. The specification and drawings are, accordingly, to be regarded in an illustrative rather than restrictive sense. The invention is intended to cover alternatives, modifications, and equivalents, which may be included within the scope of the invention as defined by the claims.

What is claimed is:

1. A method for particle beam lithography comprising:
projecting a particle beam through a first aperture, thereby forming a defined-shape particle beam;
directing the defined-shape particle beam through a second aperture that defines a cell pattern indicative of an electronic circuit block; and
selectively projecting a portion of the cell pattern on a substrate by using the first aperture as a mask to limit the exposure area of the second aperture to thereby partially expose the cell pattern to the particle beam.

2. The method of claim 1, wherein particle beam lithography comprises electron beam (EB) lithography, and wherein the particle beam comprises an electron beam.

3. The method of claim 1, wherein particle beam lithography comprises optical (light) laser lithography, and wherein the particle beam comprises an optical (light) laser beam.

4. The method of claim 1, wherein particle beam lithography comprises X-ray beam lithography, and wherein the particle beam comprises an X-ray beam.

5. The method of claim 1, wherein the first aperture is formed in an exposure mask.

6. The method of claim 1, wherein the first aperture comprises a rectangular aperture.

7. The method of claim 1, wherein the second aperture is formed in a stencil mask.

8. The method of claim 1, wherein the second aperture or cell pattern is one of a plurality of second apertures or cell patterns formed in the stencil mask.

9. The method of claim 1, wherein the cell pattern in the stencil mask includes at least two independently usable block patterns adjoining each other in a single cell area.

10. The method of claim 9, wherein the cell patterns comprise a rectangular, triangular, or rectilinear shape or contour.

11. The method of claim 9, wherein open space is secured surrounding the adjoined block patterns, and wherein the open space includes a margin large enough to allow partial projection of one of the independent block patterns selectively.

12. The method of claim 9, wherein the independently usable block patterns are arranged to adjoin each other either in a vertical direction or in a horizontal direction in the cell area.

13. The method of claim 9, wherein the independently usable block patterns are arranged to adjoin each other in both vertical and horizontal directions.

14. The method of claim 1, wherein the cell pattern in the stencil mask includes at least one block pattern and a plurality of repetitive patterns.

15. The method of claim 14, wherein the plurality of repetitive patterns cyclically repeats.

16. The method of claim 14, wherein the portion of the cell pattern projected on the substrate includes the at least one block pattern and at least one repetitive pattern.

17. The method of claim 14, wherein open space is secured surrounding the adjoined block patterns and repetitive pattern in the stencil mask, and wherein the open space includes a margin large enough to allow partial projection of one block pattern and the designated portion of the repetitive pattern.

18. A system for particle beam lithography comprising:
a particle beam source;
a first mask positioned for exposure to the particle beam source, the first mask having a first aperture; and
a second mask positioned below the first mask and above a substrate, the second mask having a second aperture that defines a cell pattern indicative of an electronic circuit block,
wherein exposing the particle beam source to the first aperture to form a defined-shape particle beam and selectively exposing the defined-shape particle beam to the second aperture forms a partial image of the cell pattern on the substrate.

19. The system of claim 18, wherein particle beam lithography comprises electron beam (EB) lithography, and wherein the particle beam source comprises an electron beam source.

20. The system of claim 18, wherein particle beam lithography comprises optical (light) laser lithography, and wherein the particle beam source comprises an optical (light) laser beam source.

21. The system of claim 18, wherein particle beam lithography comprises X-ray beam lithography, and wherein the particle beam source comprises an X-ray beam source.

22. The system of claim 18, wherein the cell pattern in the stencil mask includes at least two independently usable block patterns adjoining each other in a single cell area.

23. The system of claim 22, wherein the cell patterns comprise a rectangular, triangular, rectilinear, or polygonal shape or contour.

24. The system of claim 22, wherein open space is secured surrounding adjoined block patterns, and wherein the open space includes a margin large enough to allow partial projection of at least one of the independent block patterns selectively.

25. The system of claim 22, wherein those independently usable block patterns are arranged to adjoin each other either in a vertical direction or in a horizontal direction in the cell area.

26. The system of claim 22, wherein the independently usable block patterns are arranged to adjoin each other in both vertical and horizontal directions.

27. The system of claim 18, wherein the cell pattern in the stencil mask includes at least one block pattern and a plurality of repetitive patterns.

28. The system of claim 27, wherein the plurality of repetitive patterns cyclically repeats.

29. The system of claim 27, wherein the portion of the cell pattern projected on the substrate includes the at least one block pattern and at least one repetitive pattern.

30. The system of claim 27, wherein open space is secured surrounding the adjoined block pattern and repetitive pattern in the stencil mask, and wherein the open space includes a margin large enough to allow partial projection of at least one block pattern and the designated portion of the repetitive pattern.

31. A stencil for particle beam lithography comprising:
a plurality of cell patterns, each cell pattern being indicative of an electronic circuit block, and each cell pattern having a plurality of exposure areas within a cell area that are individually selectable;
wherein the stencil is used as a second aperture mask in a particle beam writer, the particle beam writer comprising a particle beam source, a first aperture mask, and the second aperture mask, and
wherein exposing the particle beam source to the first aperture mask forms a defined-shape particle beam, and
wherein exposing a first exposure area of a first cell pattern to the defined-shape particle beam selectively projects a first image of at least a portion of the first cell pattern on a substrate, and
wherein exposing a second exposure area of the first cell pattern, that is different from the first exposure area, to the defined-shape particle beam selectively projects a second image of at least another portion of the first cell pattern, that is different than the first image, on the substrate.

32. The stencil of claim 31, wherein particle beam lithography comprises electron beam (EB) lithography, and wherein the particle beam source comprises an electron beam source.

33. The stencil of claim 31, wherein particle beam lithography comprises optical (light) laser lithography, and wherein the particle beam source comprises an optical (light) laser.

34. The stencil of claim 31, wherein particle beam lithography comprises X-ray beam lithography, and wherein the particle beam source comprises an X-ray beam source.

35. The stencil of claim 31, wherein each cell pattern includes at least two independently usable block patterns adjoining each other in the cell area.

36. The stencil of claim 35, wherein each cell pattern comprises a rectangular, triangular, or rectilinear shape or contour so that each cell pattern is configured to mate to each other.

37. The stencil of claim 35, wherein open space is secured surrounding the adjoined block patterns, and wherein the open space includes a margin large enough to allow partial projection of at least one of the independent block patterns selectively.

38. The stencil of claim 35, wherein the independently usable block patterns are arranged to adjoin each other either in a vertical direction or in a horizontal direction in the cell area.

39. The stencil of claim 35, wherein the independently usable block patterns are arranged to adjoin each other both in vertical and horizontal directions.

40. The stencil of claim 31, wherein at least one cell pattern includes at least one block pattern and a plurality of repetitive patterns.

41. The stencil of claim 40, wherein the plurality of repetitive patterns cyclically repeats.

42. The stencil of claim 40, wherein the cell pattern projected on the substrate includes the at least one block pattern and at least one repetitive pattern.

43. The stencil of claim 40, wherein open space is secured surrounding the adjoined block pattern and repetitive pattern, and wherein the open space includes a margin large enough to allow partial projection of one block pattern and the designated portion of the repetitive pattern.

* * * * *